(12) United States Patent
Xu

(10) Patent No.: US 10,388,202 B2
(45) Date of Patent: Aug. 20, 2019

(54) GOA DRIVING CIRCUIT

(71) Applicant: Shenzhen China Star Optoelectronics Technology Co., Ltd., Shenzhen, Guangdong (CN)

(72) Inventor: Xiangyang Xu, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 36 days.

(21) Appl. No.: 15/568,229

(22) PCT Filed: Aug. 28, 2017

(86) PCT No.: PCT/CN2017/099251
§ 371 (c)(1),
(2) Date: Oct. 20, 2017

(87) PCT Pub. No.: WO2019/006841
PCT Pub. Date: Jan. 10, 2019

(65) Prior Publication Data
US 2019/0012945 A1    Jan. 10, 2019

(30) Foreign Application Priority Data
Jul. 7, 2017   (CN) .......................... 2017 1 0550965

(51) Int. Cl.
*G09G 3/36*       (2006.01)
*G09G 3/20*       (2006.01)
(Continued)

(52) U.S. Cl.
CPC ............ *G09G 3/20* (2013.01); *G02F 1/1368* (2013.01); *G02F 1/13454* (2013.01);
(Continued)

(58) Field of Classification Search
CPC ............ G09G 3/20; G09G 2310/0264; G09G 2300/0809; G02F 1/1368; G02F 1/13454; H01L 27/124
See application file for complete search history.

(56) References Cited

U.S. PATENT DOCUMENTS

2010/0260312 A1\* 10/2010 Tsai ..................... G09G 3/3677
377/79
2011/0169874 A1    7/2011 Jang et al.
(Continued)

FOREIGN PATENT DOCUMENTS

CN     104332182 A    2/2015
CN     105336305 A    2/2016
(Continued)

*Primary Examiner* — Ibrahim A Khan

(57) ABSTRACT

Disclosed is a GOA driving circuit including multistage cascaded GOA units. A current-stage GOA unit includes a pull-up control module, a pull-up module, a pull-down module, and a pull-down holding module. The pull-down holding module is configured to hold the pull-up control signal and the line-scanning signal of the current-stage GOA unit at a low level according to a second clock signal, during a scan cycle of pixel units not in a current line. The GOA driving circuit simplifies a structure of a GOA driving circuit and is conducive to a narrow-bezel design.

11 Claims, 3 Drawing Sheets

(51) Int. Cl.
*H01L 27/12* (2006.01)
*G02F 1/1345* (2006.01)
*G02F 1/1368* (2006.01)

(52) U.S. Cl.
CPC ......... *G09G 3/3677* (2013.01); *H01L 27/124* (2013.01); *G09G 2300/0809* (2013.01); *G09G 2310/0264* (2013.01); *G09G 2310/0286* (2013.01)

(56) References Cited

U.S. PATENT DOCUMENTS

| | | | | |
|---|---|---|---|---|
| 2012/0008731 | A1* | 1/2012 | Hsu | G11C 19/28 377/79 |
| 2014/0159997 | A1* | 6/2014 | Chen | G09G 3/3611 345/87 |
| 2014/0198023 | A1* | 7/2014 | Hsu | G09G 3/3674 345/99 |
| 2015/0131771 | A1* | 5/2015 | Hu | G09G 3/20 377/68 |
| 2015/0187312 | A1* | 7/2015 | Dai | G09G 3/3648 345/213 |
| 2015/0294636 | A1* | 10/2015 | Yu | G09G 3/3655 345/204 |
| 2015/0302813 | A1* | 10/2015 | Yu | G09G 3/3648 345/204 |
| 2016/0042807 | A1* | 2/2016 | Miyake | G09G 3/3266 377/64 |
| 2016/0086562 | A1* | 3/2016 | Tan | G09G 3/3677 345/215 |
| 2016/0180788 | A1* | 6/2016 | Xiao | G09G 3/3677 345/204 |
| 2016/0275887 | A1* | 9/2016 | Xiao | G09G 3/3648 |
| 2017/0364170 | A1* | 12/2017 | Gu | G02F 1/1362 |
| 2018/0293950 | A1* | 10/2018 | Lv | G09G 3/20 |
| 2019/0019442 | A1* | 1/2019 | Xu | G09G 3/3677 |

FOREIGN PATENT DOCUMENTS

| | | |
|---|---|---|
| CN | 106128401 A | 11/2016 |
| CN | 106448590 A | 2/2017 |

* cited by examiner

US 10,388,202 B2

GOA DRIVING CIRCUIT

CROSS-REFERENCE TO RELATED APPLICATIONS

The present application claims the priority of Chinese patent application CN 201710550965.1, entitled "GOA driving circuit" and filed on Jul. 7, 2017, the entirety of which is incorporated herein by reference.

FIELD OF THE INVENTION

The present disclosure relates to the technical field of liquid crystal display, and in particular, to a GOA driving circuit.

BACKGROUND OF THE INVENTION

As flat panel display technology develops, it has become a trend to develop flat display panels with a high resolution, a high contrast, a high refresh rate, a narrow bezel, and a thin body. At present, liquid crystal display (LCD) panels are still a mainstream product of panel display. In order to realize narrow-bezel, thin, and cost-effective LCD panels, a GOA (Gate Driver On Array) driving circuit has been widely used as a gate driving circuit.

FIG. 1 schematically shows a structure of a GOA driving circuit in the prior art. As shown in FIG. 1, the GOA driving circuit comprises a pull-up control module 110, a pull-up module 120, a pull-down module 130, and two pull-down holding modules 141 and 142. The pull-down holding module 141 mainly comprises thin-film transistors T51, T52, T53, T54, T32, and T42. The pull-down holding module 142 mainly comprises thin-film transistors T61, T62, T63, T64, T33, and T43. The pull-down holding module 141 is jointly controlled by a control signal LC1 which is applied to a gate of the thin-film transistor T51 and a control signal S4 which is applied to a gate of the thin-film transistor T52. The pull-down holding module 142 is jointly controlled by a control signal LC2 which is applied to a gate of the thin-film transistor T61 and a control signal S5 which is applied to a gate of the thin-film transistor T62. The control signal LC1 and the control signal LC2 are low-frequency signals with a period that is 200 times a length of a frame period and a duty ratio of 1/2. The control signal LC1 and the control signal LC2 are out of phase by 1/2 period. Alternatively driven by the control signal LC1 and the control signal LC2, the pull-down holding module 141 and the pull-down holding module 142 alternatively pull down and hold level of signals outputted by Qn node and Gn node.

As shown in FIG. 1, the two pull-down holding modules comprise 12 thin-film transistors in total, which requires much room during arrangement of wires and thus is not conducive to a narrow-bezel design.

SUMMARY OF THE INVENTION

One of the technical problems to be solved by the present disclosure is to provide a GOA driving circuit which reduces room for arrangement of wires and is conducive to a narrow-bezel design.

To solve the above technical problem, the present disclosure provides a GOA driving circuit. The GOA driving circuit comprises multiple stages of GOA units that are cascaded. A GOA unit in each stage is configured to drive one line of pixel units. A current-stage GOA unit comprises a pull-up control module, a pull-up module, a pull-down module, and a pull-down holding module. The pull-up control module is configured to output a pull-up control signal according to a line-scanning signal and a transfer signal which are outputted by a first GOA unit. The pull-up module is connected with the pull-up control module, and is configured to transform a first clock signal into a line-scanning signal of the current-stage GOA unit according to the pull-up control signal. The pull-down module is connected with the pull-up control module and the pull-up module, and is configured to simultaneously pull the pull-up control signal and the line-scanning signal of the current-stage GOA unit down to a low level according to a line-scanning signal outputted by a second GOA unit. The pull-down holding module is connected with the pull-up control module and the pull-up module, and is configured to hold the pull-up control signal and the line-scanning signal of the current-stage GOA unit at a low level according to a second clock signal, during a scan cycle of pixel units not in a current line. The first GOA unit is a GOA unit before the current-stage GOA unit and the second GOA unit is a GOA unit after the current-stage GOA unit.

Preferably, the pull-up control module comprises a first thin-film transistor. A gate of the first thin-film transistor is connected with the transfer signal outputted by the first GOA unit, a source thereof is connected with the line-scanning signal outputted by the first GOA unit, and a drain thereof is configured to output the pull-up control signal.

Preferably, the pull-up module comprises a second thin-film transistor. A gate of the second thin-film transistor is connected with the pull-up control signal, a source thereof is connected with the first clock signal, and a drain thereof is configured to output the line-scanning signal of the current-stage GOA unit.

Preferably, the pull-down module comprises a third thin-film transistor and a fourth thin-film transistor. A gate of the third thin-film transistor and a gate of the fourth thin-film transistor are inter-connected and are connected with the line-scanning signal outputted by the second GOA unit. A source of the third thin-film transistor and a source of the fourth thin-film transistor are inter-connected and are connected with a direct-current power supply signal. A drain of the third thin-film transistor is connected with the line-scanning signal of the current-stage GOA unit and a drain of the fourth thin-film transistor is connected with the pull-up control signal.

Preferably, the pull-down holding module comprises a fifth thin-film transistor and a sixth thin-film transistor. A gate of the fifth thin-film transistor and a gate of the sixth thin-film transistor are inter-connected and are connected with the second clock signal. A source of the fifth thin-film transistor and a source of the sixth thin-film transistor are inter-connected and are connected with a direct-current power supply signal. A drain of the fifth thin-film transistor is connected with the line-scanning signal of the current-stage GOA unit and a drain of the sixth thin-film transistor is connected with the pull-up control signal.

Preferably, the first clock signal and the second clock signal are pulse signals with a duty ratio of 1/4 and the first clock signal is 1/4 cycle ahead of the second clock signal.

Preferably, the first clock signal connected with the current-stage GOA unit is 1/8 cycle ahead of a first clock signal connected with a succeeding-stage GOA unit which is cascaded with the current-stage GOA unit; the second clock signal connected with the current-stage GOA unit is 1/8 cycle ahead of a second clock signal connected with the succeeding-stage GOA unit which is cascaded with the current-stage GOA unit.

Preferably, the line-scanning signal outputted by the first GOA unit comprises a line-scanning signal outputted by an $(N-2)^{th}$-stage GOA unit; the line-scanning signal outputted by the second GOA unit comprises a line-scanning signal outputted by an $(N+2)^{th}$-stage GOA unit. N stands for the current stage and N is a positive integer.

Preferably, the GOA driving unit further comprises a transfer module and the transfer module comprises a seventh thin-film transistor. A gate of the seventh thin-film transistor is connected with the pull-up control signal, a source thereof is connected with the first clock signal, and a drain thereof is configured to output the transfer signal.

Preferably, the GOA driving unit further comprises a bootstrap capacitor. A first plate of the bootstrap capacitor is connected with the pull-up control signal and a second plate thereof is connected with the line-scanning signal of the current-stage GOA unit.

Compared with the prior art, one or more embodiments of the present disclosure may have the following advantages or beneficial effects.

The present disclosure can significantly reduce the number of thin-film transistors used to form a pull-down holding module in a GOA unit, which simplifies a structure of a GOA driving circuit, reduces room for arrangement of wires in the GOA driving circuit, and thus is conducive to a narrow-bezel design.

Other advantages, objectives, and features of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure or the prior art, and constitute one part of the description. The drawings are configured for interpreting the present disclosure together with the embodiments, not for limiting the present disclosure. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Figure 1:
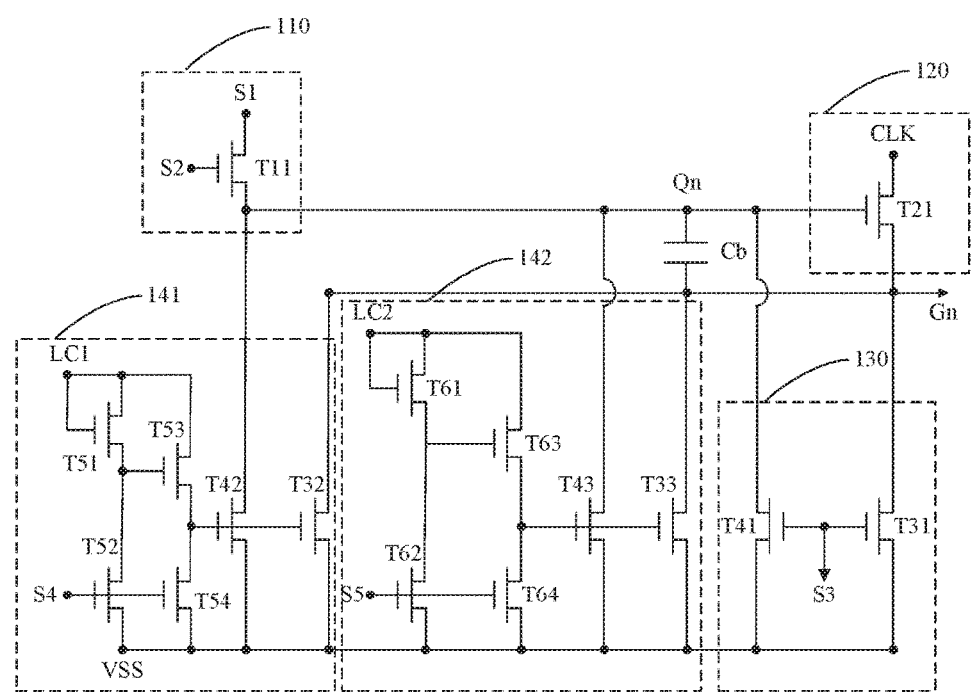
FIG. 1 schematically shows a structure of a GOA unit in a GOA driving circuit in the prior art.
Figure 2:
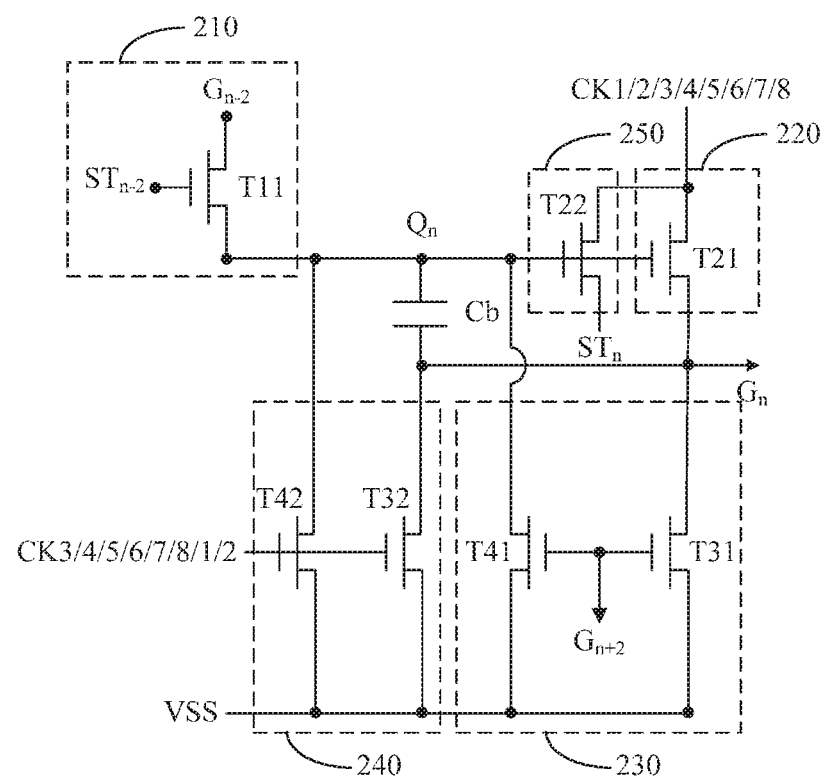
FIG. 2 schematically shows a structure of a GOA unit in a GOA driving circuit in one embodiment of the present disclosure.

The present disclosure provides a GOA driving circuit with a simple structure. FIG. 2 schematically shows an $n^{th}$-stage GOA unit of the GOA driving circuit. The $n^{th}$-stage GOA unit is configured to drive $n^{th}$-line pixel units. As shown in FIG. 2, the GOA unit comprises a pull-up control module 210, a pull-up module 220, a pull-down module 230, a pull-down holding module 240, and a transfer module 250.

The pull-up control module 210 is mainly configured to output a pull-up control signal. As shown in FIG. 2, the pull-up control module 210 in the present disclosure comprises a thin-film transistor T11 (a first thin-film transistor). A gate of the thin-film transistor T11 is connected with a control signal STn-2. The signal STn-2 stands for a transfer signal outputted by an $(N-2)^{th}$-stage GOA unit. The transfer signal will be explained in detail hereinafter. A source of the thin-film transistor T11 is connected with a line-scanning signal Gn-2 outputted by the $(N-2)^{th}$-stage GOA unit. While the signal STn-2 is at a high level, the thin-film transistor T11 is turned on. While the line-scanning signal Gn-2 also jumps to a high level, a drain of the thin-film transistor T11 outputs a pull-up control signal Qn. The pull-up control signal Qn is configured to control turn-on or turn-off of the pull-up module 220.

An input terminal of the pull-up module 220 is connected with the pull-up control signal Qn outputted by the pull-up control module. The pull-up module 220 is mainly configured to output a line-scanning signal Gn according to the pull-up control signal Qn. As shown in FIG. 2, the pull-up module 220 in the present disclosure comprises a thin-film transistor T21 (a second thin-film transistor). A gate of the thin-film transistor T21 is connected with the pull-up control signal Qn, a source thereof is connected with a clock signal CKn (a first clock signal, n is an integer from 1 to 8), and a drain thereof is used as an output terminal of a line-scanning signal of a current-stage GOA unit and is configured to output the line-scanning signal Gn. While the pull-up control signal Qn is at a high level, the thin-film transistor T21 is turned on. While the clock signal CKn also jumps to a high level, the drain of the thin-film transistor T21 outputs a line-scanning signal Gn.

The pull-down module 230 is respectively connected with the pull-up control module and an output terminal of the pull-up module. The pull-down module 230 is mainly configured to pull the pull-up control signal Qn and the line-scanning signal Gn down to a low level after pixel units of a current line are scanned. As shown in FIG. 2, the pull-down module 230 in the present disclosure comprises a thin-film transistor T31 (a third thin-film transistor) and a thin-film transistor T41 (a fourth thin-film transistor). A gate of the thin-film transistor T31 and a gate of the thin-film transistor T41 are inter-connected, and are connected with a line-scanning signal Gn+2 outputted by an $(N+2)^{th}$-stage GOA unit. A source of the thin-film transistor T31 and a source of the thin-film transistor T41 are inter-connected, and are connected with a direct-current power supply signal Vss which is held at a stable low level. A drain of the thin-film transistor T31 is connected with the output terminal of the line-scanning signal of the current-stage GOA unit. While the line-scanning signal Gn+2 is at a high level, the thin-film transistor T31 is turned on and the direct-current power supply signal Vss pulls the line-scanning signal Gn down to a low level. A drain of the thin-film transistor T41 is connected with the pull-up control signal Qn. While the line-scanning signal Gn+2 is at a high level, the thin-film transistor T41 is turned on and the direct-current power supply signal Vss pulls the pull-up control signal Qn down to a low level.

One skilled in the art shall easily appreciate that the above control signals STn−2, Gn−2, and Gn+2 can all be replaced with other signals. For example, the signal STn−2 and/or the signal Gn−2 can be replaced with a corresponding signal of a GOA unit (a first GOA unit) preceding the current-stage GOA unit; the signal Gn+2 can be replaced with a corresponding signal of a GOA unit (a second GOA unit) succeeding the current-stage GOA unit; or these signals can be an external signal inputted into the GOA driving circuit. The present disclosure is not restricted in this respect.

The transfer module 250 is configured to output a transfer signal in synchronization with the line-scanning signal. As shown in FIG. 2, the transfer module 250 in the present disclosure comprises a thin-film transistor T22 (a seventh thin-film transistor). A gate and a source of the thin-film transistor T22 are respectively connected with the gate and the source of the thin-film transistor T21. Thus, while the pull-up control signal Qn is at a high level, the thin-film transistor T22 is turned on. While the clock signal CKn also jumps to a high level, a drain of the thin-film transistor T22 outputs a transfer signal STn outputted in synchronization with the line-scanning signal Gn.

In the present disclosure, the transfer module 250 generates and outputs a transfer signal so as to realize a sequential control of a response of a pull-up control module of a GOA unit in another stage, which can increase reliability of a circuit and reduce incorrect operations.

The pull-down holding module 240 is respectively connected with the pull-up control module 210 and the pull-up module 220. The pull-down holding module 240 is mainly configured to pull the pull-up control signal Qn and the line-scanning signal Gn down and hold the pull-up control signal Qn and the line-scanning signal Gn at a low level, during a scan cycle of pixel units not in the current line. As shown in FIG. 2, the pull-down holding module 240 in the present disclosure comprises a thin-film transistor T32 (a fifth thin-film transistor) and a thin-film transistor T42 (a sixth thin-film transistor). A gate of the thin-film transistor T32 and a gate of the thin-film transistor T42 are inter-connected and are connected with a clock signal CKm (a second clock signal, m is an integer from 1 to 8). A source of the thin-film transistor T32 and a source of the thin-film transistor T42 are inter-connected and are connected with the direct-current power supply signal VSS. A drain of the thin-film transistor T32 is connected with the output terminal of the line-scanning signal of the current-stage GOA unit. While the clock signal CKm is at a high level, the thin-film transistor T32 is turned on and the direct-current power supply signal VSS pulls the line-scanning signal Gn down to a low level. A drain of the thin-film transistor T42 is connected with the pull-up control signal Qn. While the clock signal CKm is at a high level, the thin-film transistor T42 is turned on and the direct-current power supply signal VSS pulls the pull-up control signal Qn down to a low level.

In addition, as shown in FIG. 2, the GOA driving unit in the present disclosure further comprises a bootstrap capacitor Cb. A first plate of the bootstrap capacitor Cb is connected with the pull-up control signal Qn and a second plate of the bootstrap capacitor Cb is connected with the line-scanning signal Gn of the current-stage GOA unit. The bootstrap capacitor Cb is mainly configured to hold a voltage between the gate and the source of the thin-film transistor T21 and stabilize output of the thin-film transistor T21. Relevant details about the bootstrap capacitor Cb are known art and are therefore not described herein.

As can be seen from the above structure, the pull-down holding module 240 in the present disclosure only comprises 2 thin-film transistors. Compared with the prior art where the pull-down holding modules comprise 12 thin-film transistors, the present disclosure significantly reduces the number of thin-film transistors in the pull-down holding module, which simplifies a structure of a GOA driving circuit, reduces room for the GOA driving circuit, and thus is conducive to a narrow-bezel design.

Figure 3:
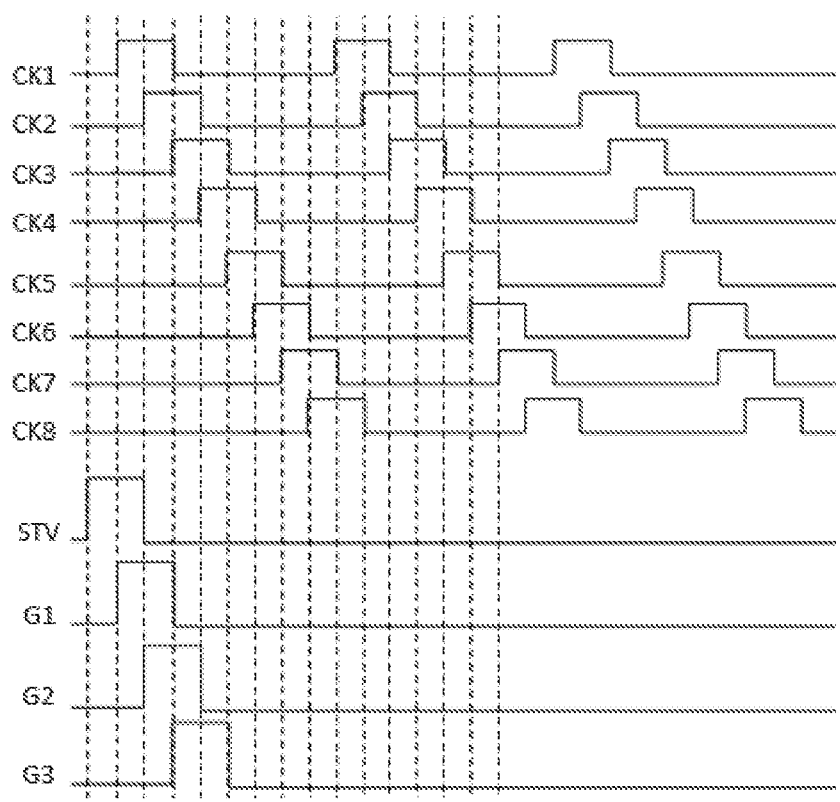
FIG. 3 schematically shows a timing sequence of a GOA driving circuit in one embodiment of the present disclosure.

FIG. 3 schematically shows a timing sequence of the GOA driving circuit during working. The working process of the GOA driving circuit in the present disclosure will be explained in detail below with reference to FIG. 3.

The GOA driving circuit is formed by cascaded GOA units as described above. Specifically, taking the $N^{th}$-stage GOA unit in FIG. 2 as an example, it is cascaded with the $(N-2)^{th}$-stage GOA unit through the pull-up control module 210 and cascaded with the $(N+2)^{th}$-stage GOA unit through the pull-down module 230.

Further, the first clock signal CKn and the second clock signal CKm in the present disclosure are pulse signals with a duty ratio of 1/4. The first clock signals CKn provided to GOA units in two adjacent stages are out of phase by a set period. Taking the $N^{th}$-stage GOA unit as an example, the first clock signal CKn provided to the $N^{th}$-stage GOA unit is 1/8 cycle ahead of a first clock signal CKn provided to an $(N+1)^{th}$-stage GOA unit. Likewise, the second clock signals CKm provided to GOA units in two adjacent stages are out of phase by a set period. Taking the $N^{th}$-stage GOA unit as an example, the second clock signal CKm provided to the $N^{th}$-stage GOA unit is 1/8 cycle ahead of a second clock signal CKm provided to the $(N+1)^{th}$-stage GOA unit.

It can be easily seen from the above that the first clock signals CKn of the GOA units in 8 successive stages can form a cycle. Likewise, the second clock signals CKm of the GOA units in 8 successive stages can also form a cycle. Thus, eight specific first/second clock signals are shown in FIG. 3 for illustration.

In addition, for a GOA unit in a same stage, the first clock signal CKn applied to the pull-up module 220 and the second clock signal CKm applied to the pull-down holding module 240 are also out of phase by a set period. Specifically, the first clock signal CKn is 1/4 cycle ahead of the second clock signal CKm. Thus, respectively corresponding to the eight first clock signals CK1, CK2, CK3, CK4, CK5, CK6, CK7, and CK8, the second clock signals are CK3, CK4, CK5, CK6, CK7, CK8, CK1, and CK2.

As shown in FIG. 2 and FIG. 3, STV stands for an initial triggering signal. In the present disclosure, the signal STV is simultaneously provided to the sources and the drains of the thin-film transistors T11 in a first-stage GOA unit and a second-stage GOA unit (that is, the signal STV simultaneously acts as the signal STn−2 and the signal Gn−2 of the first-stage GOA unit and the second-stage GOA unit). While the signal STV is at a high level, the thin-film transistors T11 in the first-stage GOA unit and the second-stage GOA unit are simultaneously turned on and pull the signal Q and the signal Q2 up to a high level, so that the thin-film transistors T21 in the first-stage GOA unit and the second-stage GOA unit are simultaneously turned on.

As shown in FIG. 3, while the clock signal CK1 arrives at a high level, the output terminal of the line-scanning signal of the first-stage GOA unit outputs a high-level line-scanning signal G1; while the clock signal CK2 arrives at a high level, the output terminal of the line-scanning signal of the second-stage GOA unit also outputs a high-level line-scanning signal G2.

When the signal G1 jumps to a high level, since the signal ST1 (outputted in synchronization with the signal G1) and the signal G1 are respectively connected with the gate and the source of the thin-film transistor T11 in a third-stage GOA unit, the thin-film transistor T11 in the third-stage GOA unit is turned on. While the clock signal CK3 arrives at a high level, the output terminal of the line-scanning signal of the third-stage GOA unit outputs a high-level line-scanning signal G3.

When the signal G3 jumps to a high level, since the signal G3 is simultaneously connected with the gate of the thin-film transistor T31 and the gate of the thin-film transistor T41 in the first-stage GOA unit, the thin-film transistor T31 and the thin-film transistor T41 are turned on, as consequences of which the signal G1 and the signal Q1 in the first-stage GOA unit are simultaneously pulled down to a low level.

Since the clock signal CK3 simultaneously acts as a control signal of the gate of the thin-film transistor T32 and the gate of the thin-film transistor T42 in the first-stage GOA unit, when the clock signal CK3 jumps to a high level, the thin-film transistor T32 and the thin-film transistor T42 are turned on, and thus the signal G1 and the signal Q1 are simultaneously pulled down. In the present disclosure, joint working of the thin-film transistors T31, T41, T32, and T42 can pull the signal G1 and the signal Q1 down to a low level more quickly.

When the signal G3 jumps back to a low level (when a line-scanning signal G5 of a fifth-stage GOA unit arrives at a high level or when the clock signal CK5 jumps to a high level, the signal G3 will be pull downed to a low level), the thin-film transistor T31 and the thin-film transistor T41 are turned off, which will be held until a next frame. Thus, at that moment, the thin-film transistor T31 and the thin-film transistor T41 are not able to pull down the level of the signal G1 and the level of the signal Q1.

After 1/4 clock signal cycle, the clock signal CK3 jumps to a high level once again. Since the gate of the thin-film transistor T32 and the gate of the thin-film transistor T42 are connected with the clock signal CK3, the thin-film transistor T32 and the thin-film transistor T42 are turned on again and start to pull down the signal G11 and the signal Q1. It shall be easily understood that during the following scan processes, the thin-film transistor T32 and the thin-film transistor T42 are periodically turned on and periodically pull down the signal G1 and the signal Q1, so that the signal G1 and the signal Q1 are stably held at a low level during the following scan processes.

In the present disclosure, the line-scanning signal Gn and the pull-up control signal Qn are pulled down and held through cooperation between the first clock signal and the second clock signal, which simplifies a structure of a GOA driving circuit and is conducive to a design of a display panel with an ultra-narrow bezel.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A GOA driving circuit, comprising multiple stages of GOA units that are cascaded, wherein a GOA unit in each stage is configured to drive one line of pixel units and wherein a current-stage GOA unit comprises:
   a pull-up control module, configured to output a pull-up control signal according to a line-scanning signal and a transfer signal which are outputted by a first GOA unit;
   a pull-up module, connected with the pull-up control module, and configured to transform a first clock signal into a line-scanning signal of the current-stage GOA unit according to the pull-up control signal;
   a pull-down module, connected with the pull-up control module and the pull-up module, and configured to simultaneously pull the pull-up control signal and the line-scanning signal of the current-stage GOA unit down to a low level according to a line-scanning signal outputted by a second GOA unit; and
   a pull-down holding module, connected with the pull-up control module and the pull-up module, and configured to hold the pull-up control signal and the line-scanning signal of the current-stage GOA unit at a low level according to a second clock signal, during a scan cycle of pixel units not in a current line;
   wherein the first GOA unit is a GOA unit before the current-stage GOA unit and the second GOA unit is a GOA unit after the current-stage GOA unit;
   wherein the pull-down holding module comprises a fifth thin-film transistor and a sixth thin-film transistor, wherein:
   a gate of the fifth thin-film transistor and a gate of the sixth thin-film transistor are inter-connected and are connected with the second clock signal;
   a source of the fifth thin-film transistor and a source of the sixth thin-film transistor are inter-connected and are connected with a direct-current power supply signal; and
   a drain of the fifth thin-film transistor is connected with the line-scanning signal of the current-stage GOA unit and a drain of the sixth thin-film transistor is connected with the pull-up control signal;
   the first clock signal connected with the current-stage GOA unit is 1/8 cycle ahead of a first clock signal connected with a succeeding-stage GOA unit which is cascaded with the current-stage GOA unit; and
   the second clock signal connected with the current-stage GOA unit is 1/8 cycle ahead of a second clock signal connected with the succeeding-stage GOA unit which is cascaded with the current-stage GOA unit.

2. The GOA driving circuit according to claim 1, wherein the pull-up control module comprises:
   a first thin-film transistor, its gate connected with the transfer signal outputted by the first GOA unit, its source connected with the line-scanning signal outputted by the first GOA unit, and its drain configured to output the pull-up control signal.

3. The GOA driving circuit according to claim 2, wherein:
   the line-scanning signal outputted by the first GOA unit comprises a line-scanning signal outputted by an $(N-2)^{th}$-stage GOA unit; and
   the line-scanning signal outputted by the second GOA unit comprises a line-scanning signal outputted by an $(N+2)^{th}$-stage GOA unit;
   wherein N stands for the current stage and N is a positive integer.

4. The GOA driving circuit according to claim 2, wherein the GOA driving unit further comprises a transfer module, wherein the transfer module comprises:

a seventh thin-film transistor, its gate connected with the pull-up control signal, its source connected with the first clock signal, and its drain configured to output the transfer signal.

5. The GOA driving circuit according to claim 2, wherein the GOA driving unit further comprises:
a bootstrap capacitor, its first plate connected with the pull-up control signal and its second plate connected with the line-scanning signal of the current-stage GOA unit.

6. The GOA driving circuit according to claim 1, wherein the pull-up module comprises:
a second thin-film transistor, its gate connected with the pull-up control signal, its source connected with the first clock signal, and its drain configured to output the line-scanning signal of the current-stage GOA unit.

7. The GOA driving circuit according to claim 1, wherein the pull-down module comprises a third thin-film transistor and a fourth thin-film transistor, wherein:
a gate of the third thin-film transistor and a gate of the fourth thin-film transistor are inter-connected and are connected with the line-scanning signal outputted by the second GOA unit;
a source of the third thin-film transistor and a source of the fourth thin-film transistor are inter-connected and are connected with a direct-current power supply signal; and
a drain of the third thin-film transistor is connected with the line-scanning signal of the current-stage GOA unit and a drain of the fourth thin-film transistor is connected with the pull-up control signal.

8. The GOA driving circuit according to claim 1, wherein the first clock signal and the second clock signal are pulse signals with a duty ratio of 1/4 and the first clock signal is 1/4 cycle ahead of the second clock signal.

9. The GOA driving circuit according to claim 1, wherein:
the line-scanning signal outputted by the first GOA unit comprises a line-scanning signal outputted by an $(N-2)^t$-stage GOA unit; and
the line-scanning signal outputted by the second GOA unit comprises a line-scanning signal outputted by an $(N+2)^{th}$-stage GOA unit;
wherein N stands for the current stage and N is a positive integer.

10. The GOA driving circuit according to claim 1, wherein the GOA driving unit further comprises a transfer module, wherein the transfer module comprises:
a seventh thin-film transistor, its gate connected with the pull-up control signal, its source connected with the first clock signal, and its drain configured to output the transfer signal.

11. The GOA driving circuit according to claim 1, further comprising:
a bootstrap capacitor, its first plate connected with the pull-up control signal and its second plate connected with the line-scanning signal of the current-stage GOA unit.

* * * * *